United States Patent [19]

Tomesakai

[11] Patent Number: 5,631,590
[45] Date of Patent: May 20, 1997

[54] SYNCHRONIZED CLOCK SIGNAL REGENERATING CIRCUIT

[75] Inventor: Nobuaki Tomesakai, Kawasaki, Japan

[73] Assignee: Fujitsu Limited, Kawasaki, Japan

[21] Appl. No.: 533,210

[22] Filed: Sep. 25, 1995

[30] Foreign Application Priority Data

Nov. 4, 1994 [JP] Japan ................................. 6-270755

[51] Int. Cl.$^6$ ........................................... H03L 7/06
[52] U.S. Cl. ........................................ 327/156; 327/163
[58] Field of Search ........................... 327/141, 146–150, 327/155–159, 162, 163, 165, 2, 3, 5, 12, 39–41, 291; 331/1 A, 11, 14, 25

[56] References Cited

U.S. PATENT DOCUMENTS

| | | | |
|---|---|---|---|
| 4,787,097 | 11/1988 | Rizzo | 331/11 |
| 4,803,705 | 2/1989 | Gillingham et al. | 331/1 A |
| 4,987,373 | 1/1991 | Soo | 327/147 |
| 5,015,970 | 5/1991 | Williams et al. | 331/1 A |
| 5,302,916 | 4/1994 | Pritchett | 331/1 A |
| 5,304,954 | 4/1994 | Saito et al. | 331/1 A |
| 5,487,093 | 1/1996 | Adresen et al. | 331/1 A |
| 5,493,243 | 2/1996 | Ghoshal | 327/150 |

FOREIGN PATENT DOCUMENTS 4-326204 11/1992 Japan .
6-38116 2/1994 Japan .

*Primary Examiner*—Toan Tran
*Attorney, Agent, or Firm*—Nikaido, Marmelstein, Murray & Oram LLP

[57] ABSTRACT

A clock signal regenerating circuit includes a first PLL circuit, a PLL part circuit which forms a second PLL circuit in cooperation with the first PLL circuit, the second PLL circuit performing a frequency-synchronizing operation on a clock signal and a data signal. The first PLL circuit performs a phase-synchronizing operation on the clock signal and an output signal of the PLL part circuit. The phase-synchronizing operation has a speed lower than that of the frequency-synchronizing operation.

9 Claims, 17 Drawing Sheets

VOLTAGE DIFFERENCE VA-VB

SYNCHRONIZED CLOCK SIGNAL REGENERATING CIRCUIT

BACKGROUND OF THE INVENTION

1. Field of the Invention

The present invention generally relates to clock signal regenerating circuits, and more particularly to a clock signal regenerating circuit which generates (extracts) a clock signal from a data signal such as an NRZ (Non-Return to Zero) signal. Further, the present invention is concerned with a load capacitance controlling circuit which controls a voltage-controlled oscillator used for a clock signal regenerating circuit or the like.

The clock signal regenerating technique is needed to realize advanced information communications such as optical fiber communications and high-vision communications. Recently, a PLL (Phase-Locked Loop) circuit operating in the order of giga-heltz has been attracted as a circuit which configures the clock signal regenerating circuit.

2. Description of the Related Art

FIG. 1 is a block diagram of a conventional PLL circuit. The PLL circuit shown in FIG. 1 includes an input terminal 1 to which an input signal SIN is applied, an output terminal 2 via which an output signal SOUT is output, a phase/frequency detector (PFD) 3, a charge pump circuit (CP) 4, an amplifier (AMP) 5, a loop filter (LP) 6, and a voltage-controlled oscillator (VCO) 7.

The phase/frequency detector 3 detects the frequency difference between the input signal SIN and the output signal SOUT. The frequency signal is applied to the charge pump circuit 4, which performs a charging or discharging operation on a built-in capacitor. The amplifier 5 amplifies the output signal of the charge pump circuit 4, and results in voltage signals VA and VB. The voltage-controlled oscillator 7 is controlled so that the oscillation frequency of the output signal SOUT can be controlled by the voltage signals VA and VB. In this way, the frequency difference between the input signal SIN and the output signal SOUT is reduced and is made to finally become zero.

In the above PLL circuit, the frequency of the input signal SIN is needed to be close to the oscillation frequency of the voltage-controlled oscillator 7. Hence, if the input signal SIN is a data signal which changes at random, the PLL circuit cannot perform the PLL operation. As a result, it is necessary to modify the PLL circuit in order to apply the PLL circuit to the clock signal regenerating circuit.

The phase/frequency detector 3 simultaneously performs the phase and frequency comparing operations. When there is a frequency difference or a phase difference between the input signal SIN and the output signal SOUT, the phase/frequency detector 3 cannot instantaneously determines whether the difference is a frequency difference or a phase difference. Hence, the PLL circuit has a disadvantage in which pulling-out of the phase is apt to occur. In this regard, the PLL circuit cannot be used as the clock signal regenerating circuit without any modification.

SUMMARY OF THE INVENTION

It is a general object of the present invention to eliminate the above disadvantages.

A more specific object of the present invention is to provide a clock signal regenerating circuit utilizing a PLL circuit in which the phase cannot be pulled out easily and hence the stable clock signal regenerating operation can be ensured.

Another object of the present invention is to provide a load capacitance controlling circuit capable of performing a fine frequency control of the oscillation frequency of a voltage-controlled oscillator and suitably applicable to a clock signal regenerating circuit whereby the phase cannot be pulled out easily and hence the stable clock signal regenerating operation can be ensured.

The above objects of the present invention are achieved by a clock signal regenerating circuit comprising:

a first PLL circuit;

a PLL part circuit which forms a second PLL circuit in cooperation with the first PLL circuit, the second PLL circuit performing a frequency-synchronizing operation on a clock signal and a data signal, the first PLL circuit performing a phase-synchronizing operation on the clock signal and an output signal of the PLL part circuit, the phase-synchronizing operation having a speed lower than that of the frequency-synchronizing operation.

The above objects of the present invention are achieved by a load capacitance controlling circuit which controls a load capacitance of a voltage-controlled oscillator having first and second field effect transistors which alternately turn ON and OFF to thereby produce first and second oscillation outputs having a complementary relationship, the load capacitance controlling circuit comprising:

a first resistance element having a first end connected to high-potential-size power supply line, and a second end;

a third field effect transistor having a drain connected to the second end of the first resistance element, a gate connected to a drain of the first field effect transistor, and a source;

a fourth field effect transistor having a drain connected to the source of the third field effect transistor, a source connected to a low-potential-side power supply line, and a gate receiving a control voltage;

a second resistance element having a first end connected to the high-potential-side power supply line, and a second end;

a fifth field effect transistor having a drain connected to the second end of the second resistance element, a gate connected to the drain of the second field effect transistor, and a source;

a sixth field effect transistor having a drain connected to the source of the fifth field effect transistor, a source connected to the low-potential-side power supply line, and a gate receiving the control voltage.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
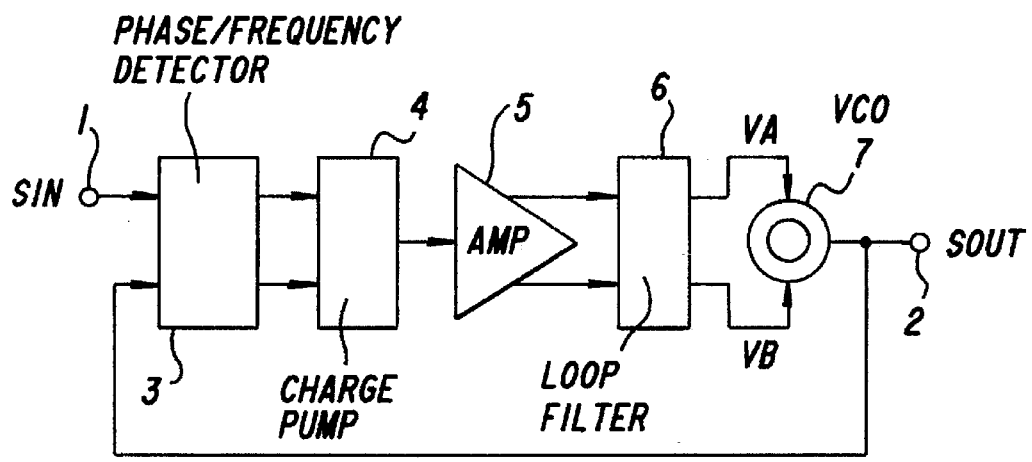
FIG. 1 is a block diagram of a conventional PLL circuit.
Figure 2:
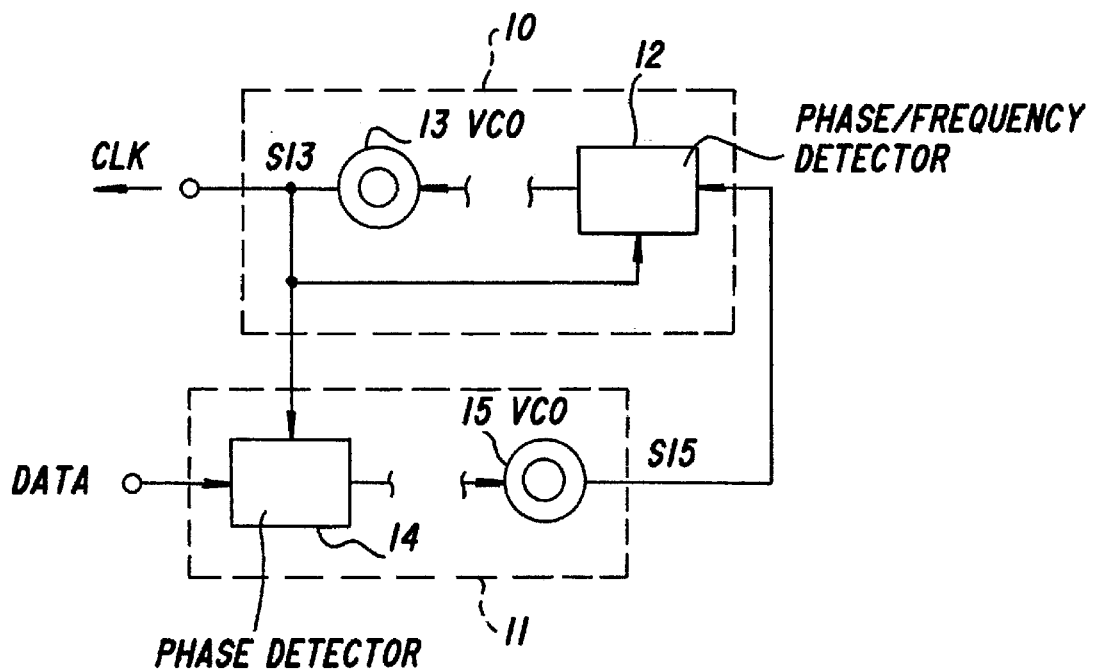
FIG. 2 is a block diagram of the principle of a clock signal regenerating circuit according to the present invention.

FIG. 2 is a diagram of the principle of a clock signal regenerating circuit according to the present invention. The clock signal regenerating circuit shown in FIG. 2 is made up of a PLL circuit 10 and a PLL part circuit 11. A signal S13 output from the PLL circuit 10 is output as a clock signal CLK regenerated from a data signal DATA applied to the PLL part circuit 11.

The PLL circuit 10 includes a phase/frequency detector 12 to which signals S13 and S15 are applied, and a voltage-controlled oscillator 13 which outputs the signal S13. The PLL circuit 10 operates so that the signal S13 is frequency-synchronized with the signal S15.

The PLL part circuit 11 includes a phase detector 14 to which the data signal DATA and the signal S13 are applied, and a voltage-controlled oscillator 15 which outputs the signal S15. The PLL part circuit 11 forms another (second) PLL circuit together with the PLL circuit 10. The phase-synchronizing operation speed of the PLL part circuit 11 is made to be slower than the frequency-synchronizing operation speed of the PLL circuit 10. The second PLL circuit functions to phase-synchronize the signal S13 with the data signal DATA.

More particularly, the PLL circuit 10 operates so as to establish the frequency-synchronization between the signals S13 and S15. The PLL part circuit 11 operates so as to establish the phase-synchronization between the signal S13 and the data signal DATA. The PLL part circuit has a phase-synchronizing operation speed lower than the frequency-synchronizing operation speed of the PLL circuit 10. When the data signal DATA is applied to the PLL part circuit 11, the signal S13 is pulled in frequency-synchronization with the signal S15, and is then pulled in phase-synchronization with the data signal DATA.

Figure 3:
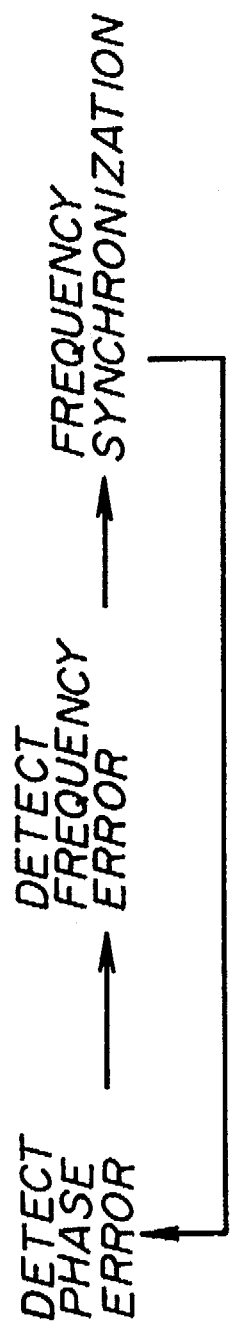
FIG. 3 is a diagram of a synchronizing process of the present invention.

FIG. 3 shows the above synchronizing process in the clock signal regenerating circuit. If the frequency of the data signal DATA much deviates from the signal S13 in a case where a phase error is detected, a frequency error is detected and corrected first. In this way, the frequency error can be processed separately from the phase error and can be corrected much faster than the phase error. Hence, according to the present invention, the phase pull out cannot occur after the clock signal is pulled in synchronization unless the frequency of the data signal much deviates, and hence the stable clock signal regenerating operation can be ensured.

The structure shown in FIG. 2 can be modified so that frequency dividers which respectively frequency-divide the signals S13 and S15, and the frequency-divided versions thereof are applied to the phase/frequency detector 12. The structure shown in FIG. 2 can also be modified so that the voltage-controlled oscillator 15 can be an external device while the other parts are formed on a chip or board.

Figure 4:
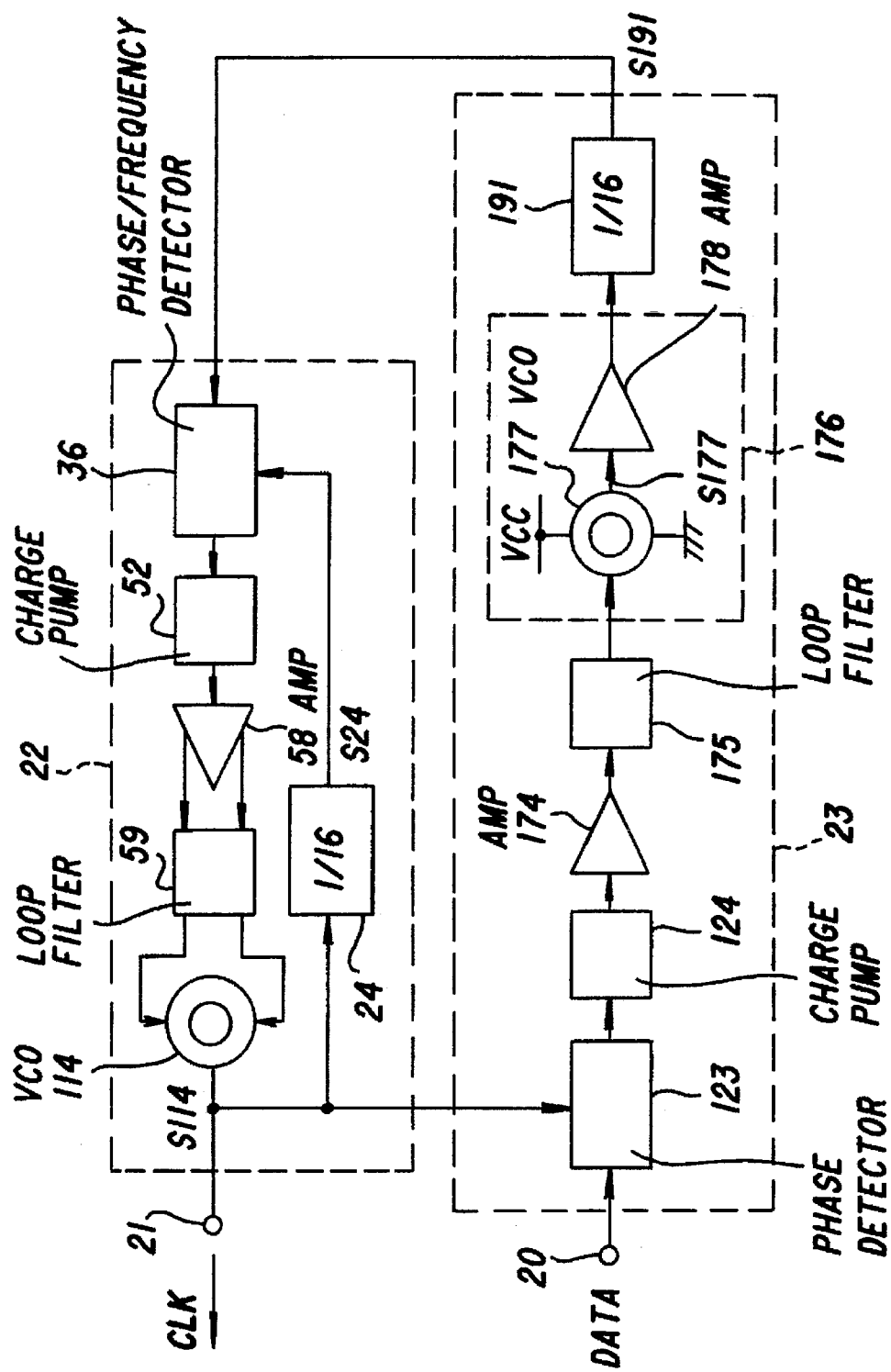
FIG. 4 is a block diagram of a clock signal regenerating circuit according to a first embodiment of the present invention.

FIG. 4 is a block diagram of a clock signal regenerating circuit according to a first embodiment of the present invention. The circuit shown in FIG. 4 has a data signal input terminal 20 to which the data signal DATA is input, and a clock signal output terminal 21 via which the clock signal regenerated from the data signal DATA is output.

The circuit shown in FIG. 4 also has a PLL circuit 22, and a PLL part circuit 23 that forms another (second) PLL circuit in cooperation with the PLL circuit 22. A signal S114 output from the PLL circuit 22 is output as the clock signal regenerated from the data signal DATA.

The PLL circuit 22 has a frequency divider 24, which divides the frequency of the signal S114 by 16 so that a frequency-divided signal having a frequency as low as 1/16 of the frequency of the signal S114.

Figure 5:
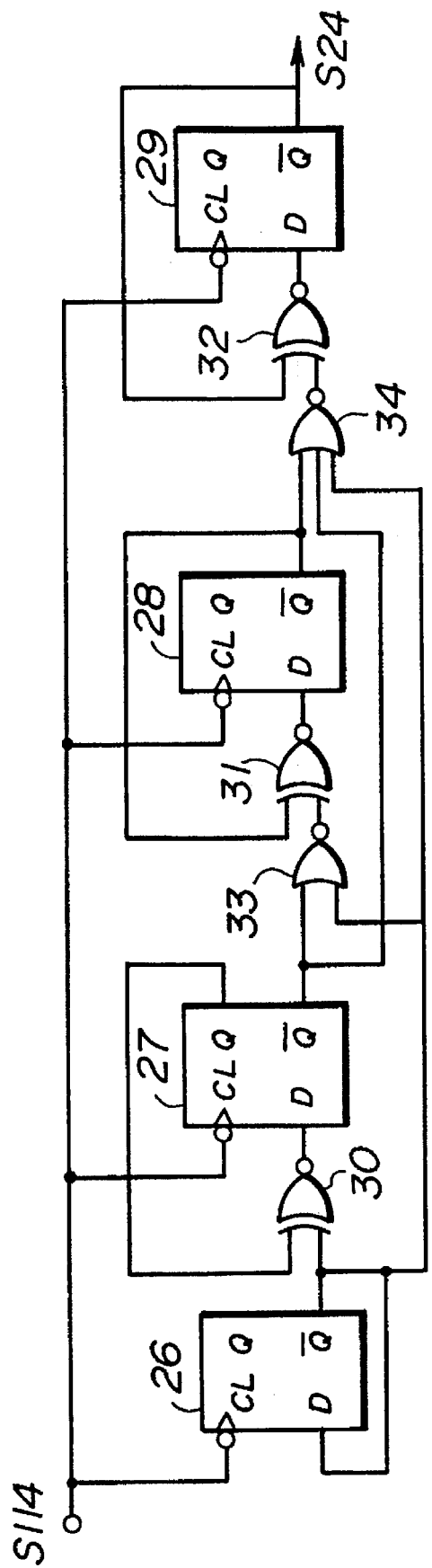
FIG. 5 is a block diagram of a frequency divider shown in FIG. 4.

FIG. 5 is a block diagram of the frequency divider 24, which is made up of D-type flip-flops 26–29, exclusive-NOR (E-NOR) circuits 30–32, and NOR circuits 33 and 34.

Turning now to FIG. 4, the PLL circuit 22 includes a phase/frequency detector 36, which detects a frequency error between an output signal S191 of the PLL part circuit 23 and the signal S24 output from the frequency divider 24.

Figure 6:
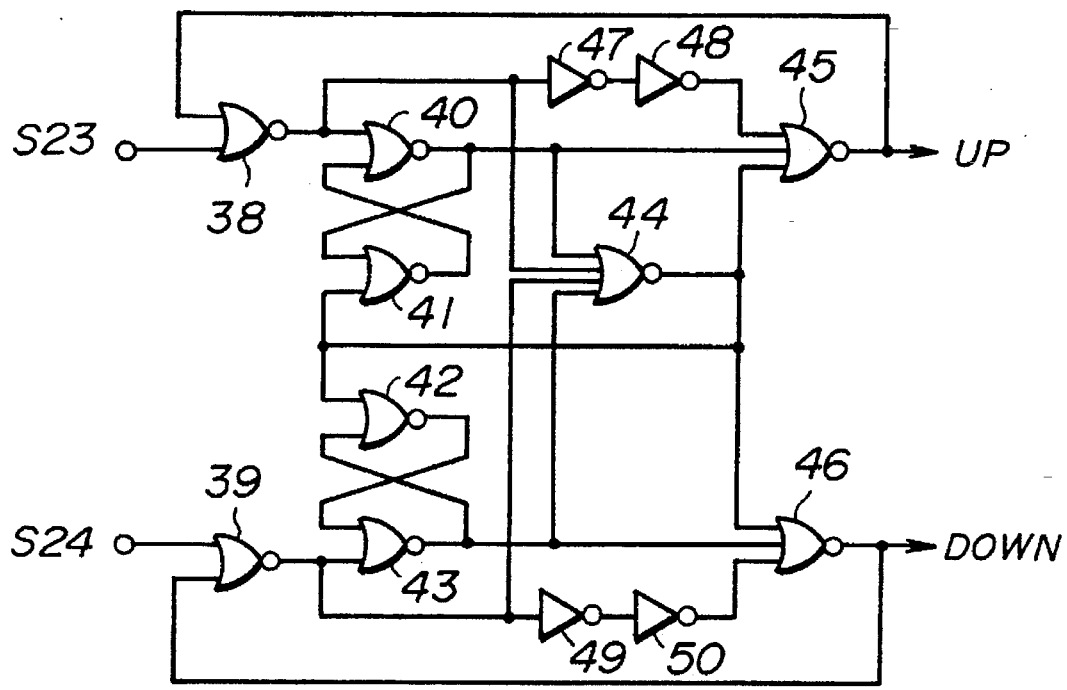
FIG. 6 is a block diagram of a phase/frequency detector shown in FIG. 4.

FIG. 6 is a block diagram of the phase/frequency detector 36, which is made up of NOR circuits 38–46 and inverters 47–50. The detector 36 outputs an up pulse UP and a down pulse DOWN.

Turning to FIG. 4 again, the PLL circuit 22 includes a charge pump circuit 52 to which the up pulse UP and the down pulse DOWN are applied.

Figure 7:
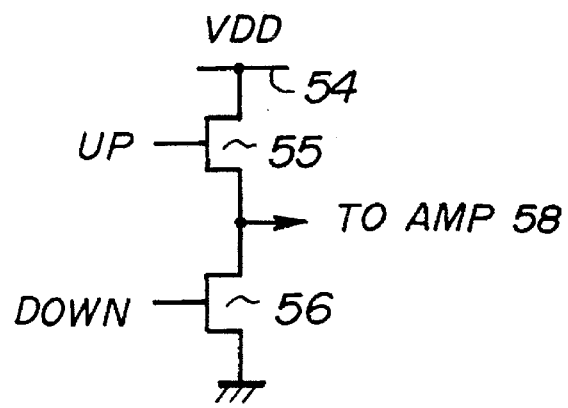
FIG. 7 is a circuit diagram of a charge pump circuit shown in FIG. 4.

FIG. 7 is a circuit diagram of the charge pump circuit 52, which includes a VCC power supply line carrying a power supply voltage VDD, an enhancement type GaAs MESFET (MEtal Semiconductor Field Effect Transistor) 55, which is turned ON/OFF by the up pulse UP, and an enhancement type GaAs MESFET 56, which is turned ON/OFF by the down pulse DOWN.

Figure 8:
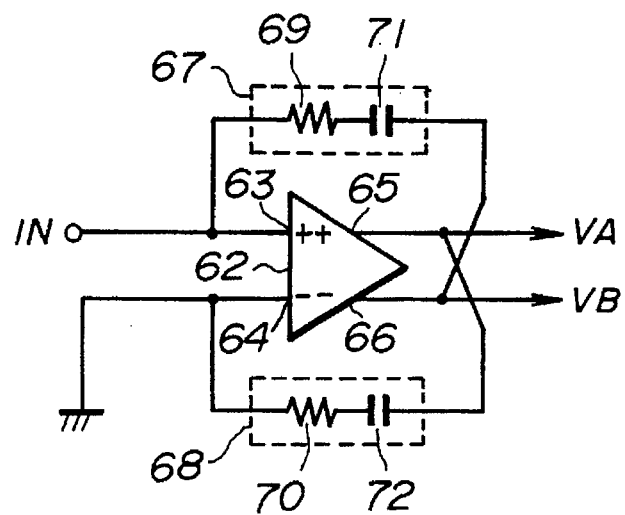
FIG. 8 is a block diagram of an amplifier and a loop filter shown in FIG. 4.

Turning to FIG. 4 again, the PLL circuit 22 includes an amplifier 58 and a loop filter 59, which are configured as shown in FIG. 8. The circuit shown in FIG. 8 includes a fully differential amplifier 62 having a non-inverting input terminal 63, an inverting input terminal 64, a non-inverting output terminal 65, and an inverting output terminal 66. Symbol VA is the voltage output via the non-inverting output terminal 65, and symbol VB is the voltage output via the inverting output terminal 66. The circuit shown in FIG. 8 includes impedance circuits 67 and 68, which form the loop filter 59 in cooperation with the fully differential amplifier 62. The impedance circuit 67 has a resistor 69 and a capacitor 71, and the impedance circuit 68 has a resistor 70 and a capacitor 72.

The circuit shown in FIG. 8 can be modified so that the analog input signal IN is applied to the non-inverting input terminal 63 of the fully differential amplifier 62, while an analog signal/IN having the analog inverting relation to the input signal IN is applied to the non-inverting terminal 64.

Figure 9:
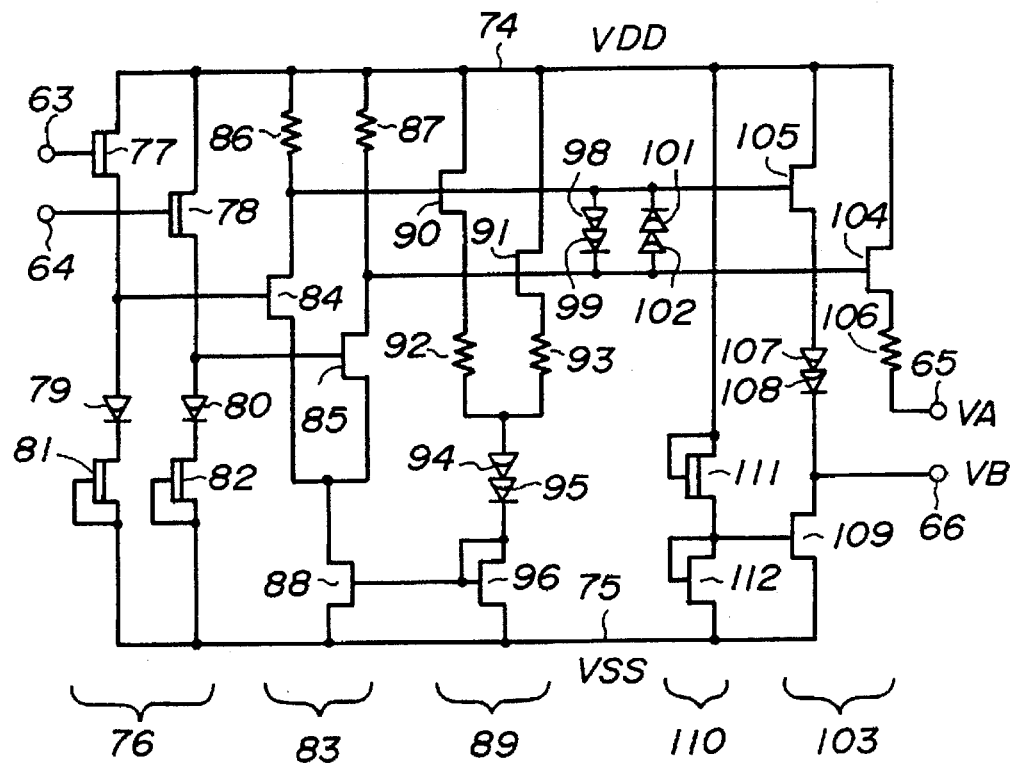
FIG. 9 is a circuit diagram of a fully differential amplifier shown in FIG. 4.

FIG. 9 is a circuit diagram of the fully differential amplifier 62, which has a VDD power supply line 74 carrying the power supply voltage VDD, and a VSS power supply line 75 carrying a power supply voltage VSS. The circuit shown in FIG. 9 includes an input circuit 76, depletion type GaAs MESFETs 77 and 78 serving as input transistors, Schottky diodes 79 and 80 forming level shifters, and depletion type GaAs MESFETs serving as constant-current sources.

The circuit shown in FIG. 9 includes a differential amplifier circuit of a resistance load type, which includes enhancement type GaAs MESFETs 84 and 85 performing the differential operation, load resistors 86 and 87, and an enhancement type GaAs MESFET 88 serving as a constant-current source.

The circuit shown in FIG. 9 includes a common mode feedback circuit 89, which adjusts the voltage values of the output voltages VA and VB. The circuit 89 includes enhancement type GaAs MESFETs 90 and 91 receiving the outputs of the differential amplifier circuits 83, and resistors 92 and 93. Further, the circuit 89 includes Schottky diodes 94 and 95 serving as level shifters, and an enhancement type GaAs MESFET 96 forming a current-mirror circuit together with the GaAs MESFET 88 of the differential amplifier circuit 83.

The circuit 89 further includes Schottky diodes 98 and 99 serving as clipping circuits for regulating the maximum value of the voltage difference VB−VA. Furthermore, the circuit 89 includes Schottky diodes 101 and 102 serving as clipping circuits for regulating the maximum value of the voltage difference VA−VB.

The circuit shown in FIG. 9 includes an output circuit 103, which is made up of enhancement type GaAs MESFETs 104 and 105 serving as output transistors, a resistor 106, Schottky diodes 107 and 108 serving as level shifters, and an enhancement type GaAs MESFET 109 serving as a constant-current source.

The circuit shown in FIG. 9 includes a gate bias voltage supply circuit 110, which supplies a gate bias voltage to the GaAs MESFET 109. The circuit 110 includes a depletion type GaAs MESFET 111, and an enhancement type GaAs MESFET 112.

Turning to FIG. 4 again, the PLL circuit 22 includes a voltage-controlled oscillator 114 of a multivibrator type, which operates with a relatively high power supply voltage and a relatively low power supply voltage respectively corresponding to the voltages VA and VB output from the amplifier 58.

Figure 10:
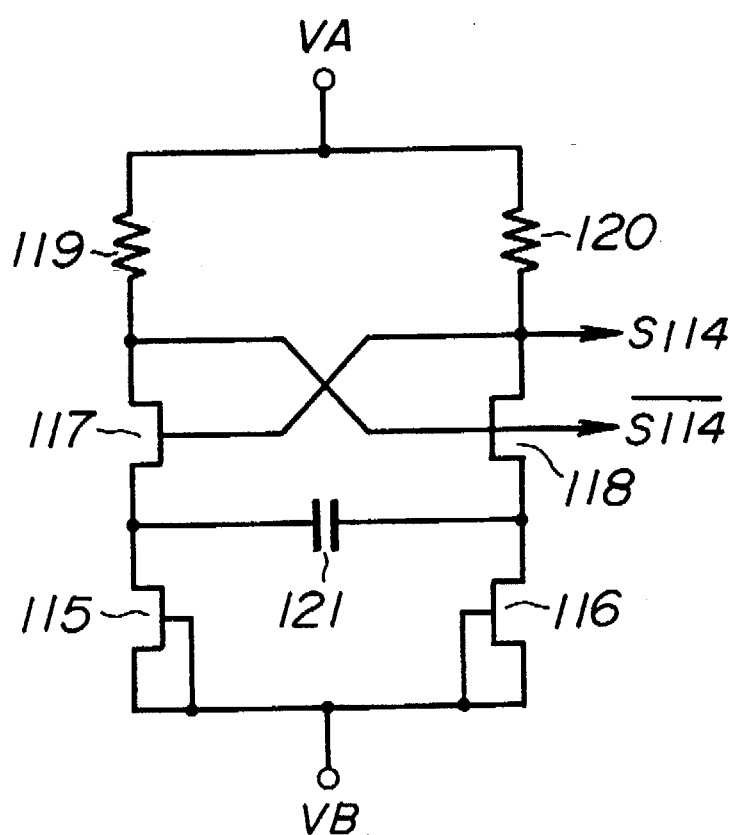
FIG. 10 is a circuit diagram of a voltage-controlled oscillator shown in FIG. 4.

FIG. 10 is a circuit diagram of the voltage-controlled oscillator 114, which includes enhancement type GaAs MESFETs 115 and 116 serving as constant-current sources, enhancement type GaAs MESFETs 117 and 118 performing switching operations, load resistors 119 and 120, and a capacitor 121 which is charged or discharged. The charging and discharging operation on the capacitor 121 is repeatedly carried out by utilizing the currents flowing in the GaAs MESFETs 117 and 118. Hence, the GaAs MESFETs 117 and 118 are alternately turned ON and OFF, so that oscillation outputs S114 and/S114 having a frequency corresponding to the voltage difference VA−VB can be obtained.

The PLL part circuit 23 shown in FIG. 4 is configured as follows. The PLL part circuit 23 includes a phase detector (PD) 123 and a charge pump circuit (CP) 124. The phase detector 123 detects the phase difference between the data signal DATA and the output signal S114 of the voltage-controlled oscillator 114 of the PLL circuit 22.

Figure 11:
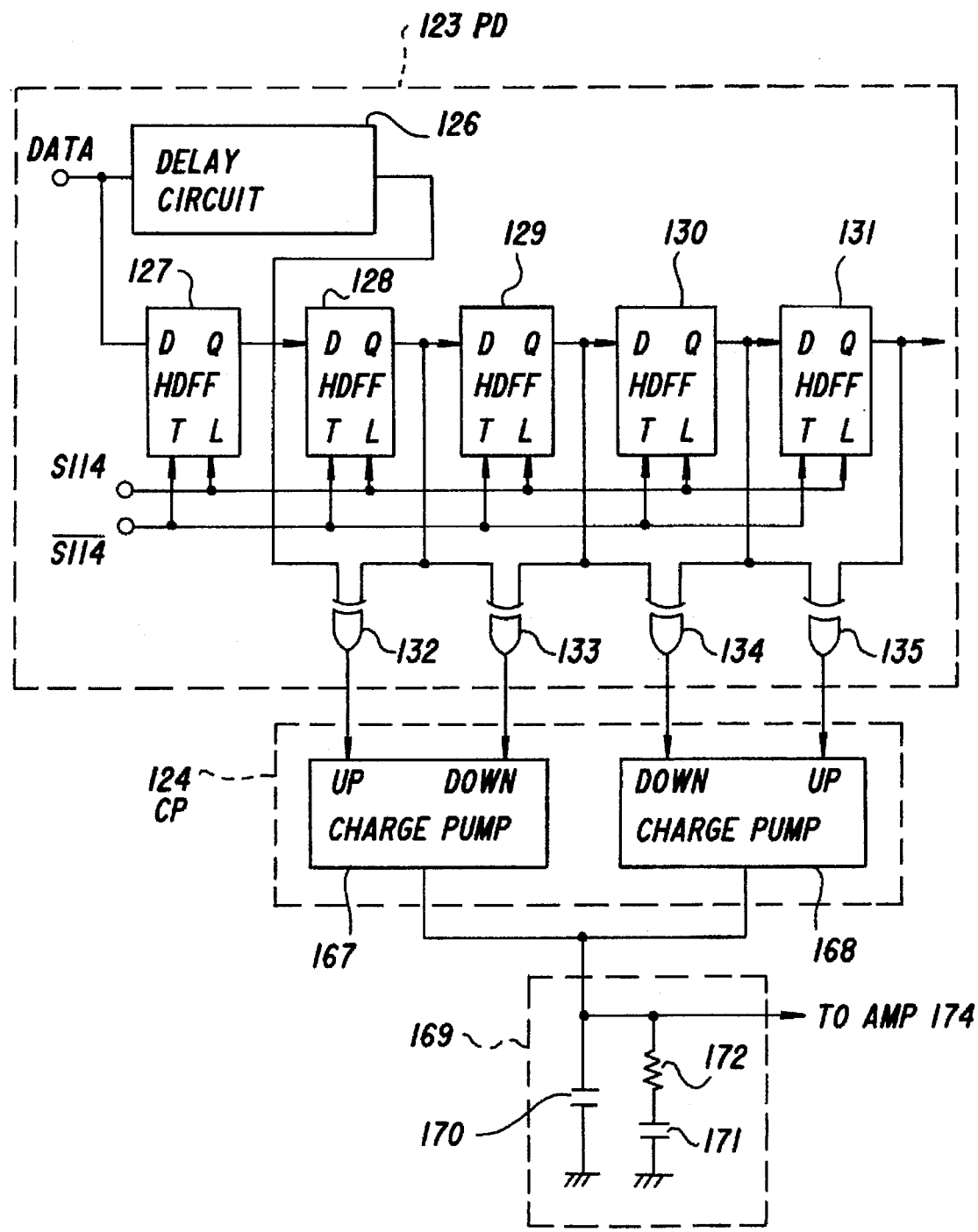
FIG. 11 is a circuit diagram of a phase detector and a charge pump circuit shown in FIG. 4.

FIG. 11 shows a configuration of the phase detector 123 and the charge pump circuit 124. The phase detector 123 includes a delay circuit 126 which delays the data signal DATA, half-D-type flip-flop circuits (HDFF) 127 through 131, and exclusive-OR circuits 132 through 135. The half-D-type flip-flop circuits 127–131 are cascaded, and receive, through respective latch signal input terminals L, the signal S114 from the voltage-controlled oscillator 114 of the PLL circuit 22. Further, the circuits 127–131 receive the signal/S114 through respective transfer signal input terminals T.

Figure 12:
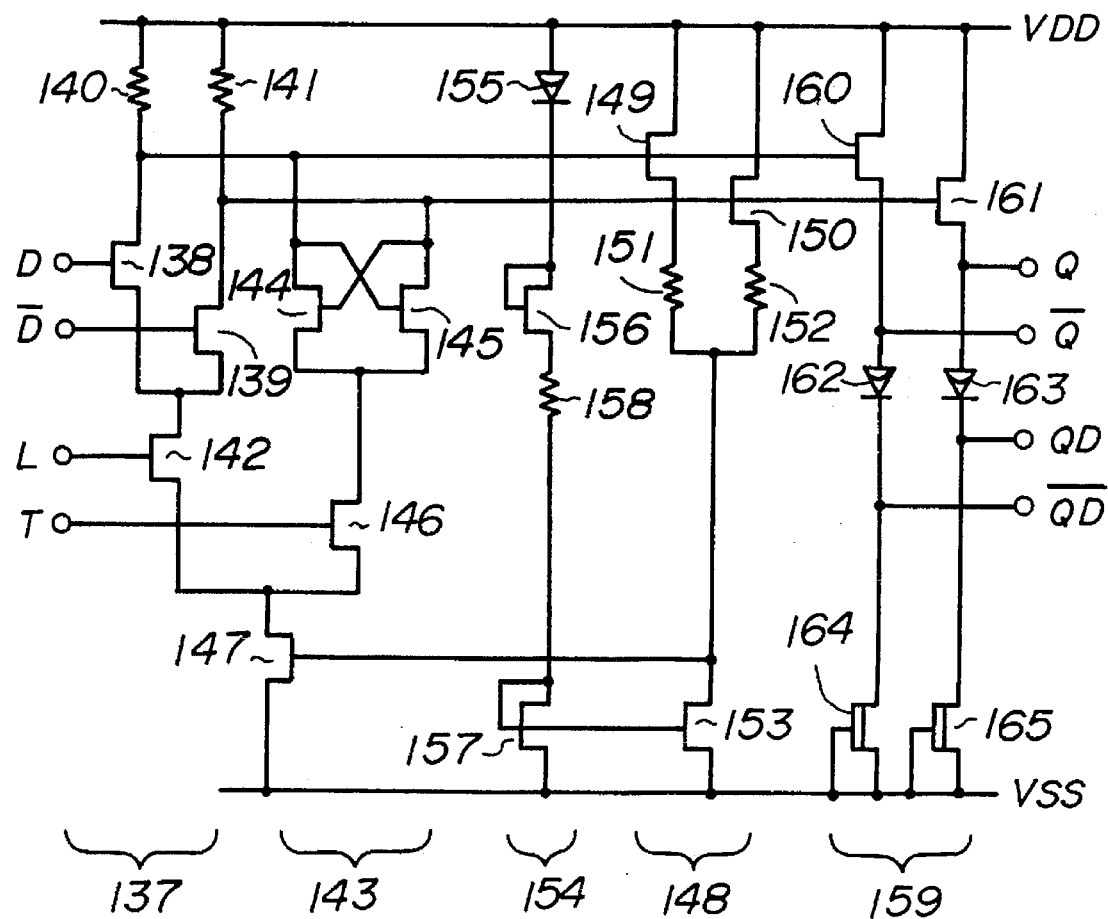
FIG. 12 is a circuit diagram of each half-D-type flip-flop circuit.

Each of the half-D-type flip-flop circuits 127–131 is configured as shown in FIG. 12. The circuit shown in FIG. 12 includes an input circuit 137 made up of enhancement type GaAs MESFETs 138 and 139 serving as input transistors, and load resistors 140 and 141. The input circuit 137 has an enhancement type GaAs MESFET 142, which is turned ON or OFF in response to the latch signal applied to the latch signal input terminal L. Hence, the input circuit 137 is activated or made inactive.

The circuit shown in FIG. 12 includes a flip-flop circuit 143, which includes enhancement type GaAs MESFETs 144 and 145. The circuit 143 includes an enhancement type GaAs MESFET 146, which is turned ON or OFF in response to the transfer signal applied to the transfer signal input terminal L. Hence, the flip-flop circuit 143 is switched to the active state or the inactive state. An enhancement type GaAs MESFET 147 is commonly provided to the input circuit 137 and the flip-flop circuit 143, and functions as a constant-current source.

The circuit shown in FIG. 12 has a common mode feedback circuit 148, which is made up of enhancement type GaAs MESFETs 149 and 150, resistors 151 and 152, and an enhancement type GaAs MESFET 153 serving as a constant-current source. The circuit shown in FIG. 12 has a gate bias voltage supply circuit 154, which supplies the GaAs MESFET 153 with a gate bias voltage. The circuit 154 has a Schottky diode 155, enhancement type GaAs FETs 156 and 157, and a resistor 158. The GaAs MESFET 157 forms a current-mirror circuit in cooperation with the GaAs MESFET 153, so that a constant current can be made to flow in the GaAs MESFET 153.

The circuit shown in FIG. 12 has an output circuit 159, which is made up of enhancement type GaAs MESFETs 160 and 161, Schottky diodes 162 and 163 serving as level shifters, and depletion type GaAs MESFETs 164 and 165 functioning as constant current sources.

The charge pump circuit 124 shown in FIG. 11 includes charge pump circuits 167 and 168, each having the same configuration as that of the charge pump circuit 52 shown in FIG. 4 (FIG. 7).

The circuit shown in FIG. 11 has a ripple removing circuit 169, which is made up capacitors 170 and 171, and a resistor 172. The ripple removing circuit 169 is not shown in FIG. 4 for the sake of simplicity.

Turning to FIG. 4 again, the PLL part circuit 23 includes an amplifier (AMP) 174 and a loop filter 175, which are configured in the conventional way. Further, the PLL part circuit 23 includes an external circuit 176, which is made up of a voltage-controlled oscillator 177 and an amplifier 178. The voltage-controlled oscillator 177 is configured as shown in FIG. 13.

Figure 13:
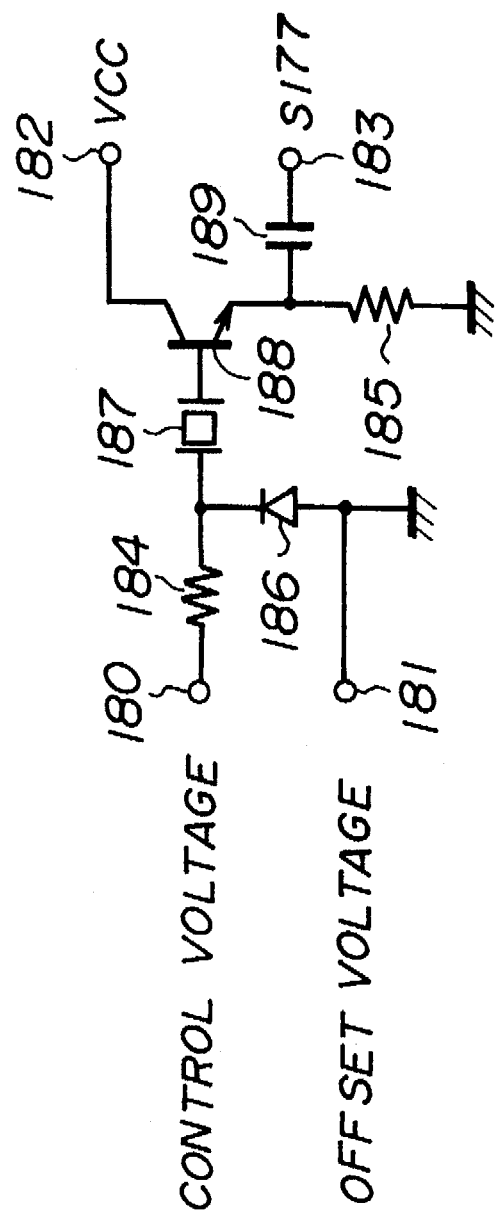
FIG. 13 is a circuit diagram of a voltage-controlled oscillator.
Figure 14A:
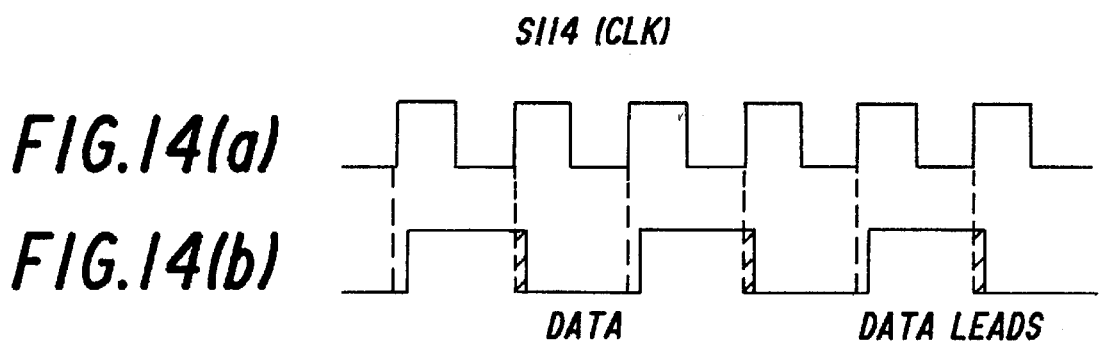
FIG. 14 is a diagram showing the operation of the first embodiment of the present invention.
Figure 14C:
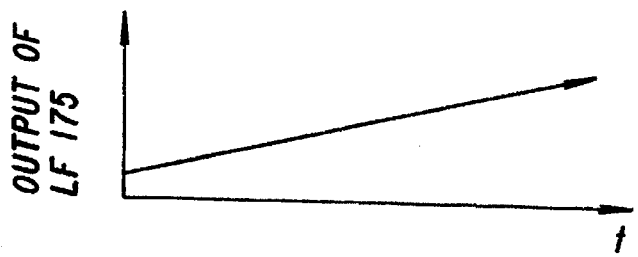
Figure 14D:
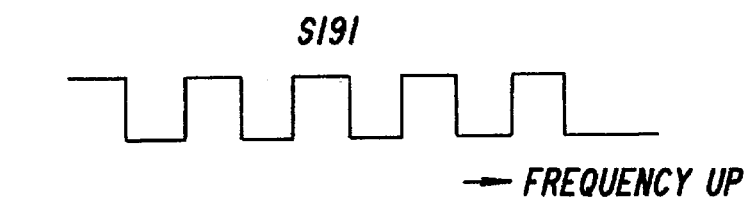
Figure 14E:
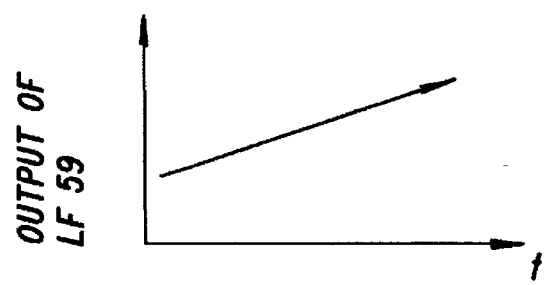
Figure 14F:
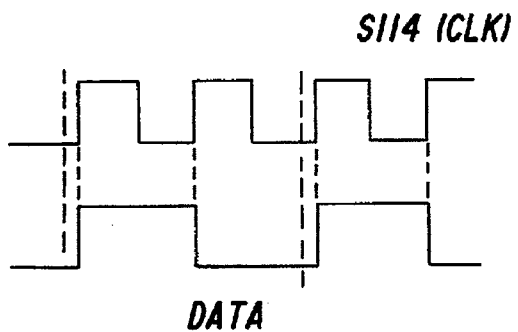

Referring to FIG. 13, the oscillator 177 includes a control voltage input terminal 180, an offset voltage input terminal 181, a power supply voltage input terminal 182, and an oscillation output terminal 183. A control voltage for controlling the oscillation frequency is applied to the control voltage input terminal 180. An offset voltage is applied to the offset voltage input terminal 181. A power supply voltage VCC is applied to the power supply voltage input terminal 182. An oscillation output S177 is output via the oscillation output terminal 183. The output signal of the loop filter 175 shown in FIG. 4 is applied to the offset voltage input terminal 181.

Further, the circuit shown in FIG. 13 includes resistors 184 and 185, a diode 186, a piezoelectric resonator 187 made of a piezoelectric element which may be LiTaO₃, an NPN transistor 188 and a capacitor 189.

Turning to FIG. 4, the PLL part circuit 23 has a frequency divider 191, which divides the frequency of the output signal from the external circuit 176 by 16, so that the frequency as low as 1/16 of the frequency of the above output signal can be obtained. The frequency divider 191 can be configured in the same way as the aforementioned frequency divider 24.

A description will now be given of the operation of the first embodiment of the present invention. When the data signal DATA is applied to the data input terminal 20 shown in FIG. 4, the phase detector 123 supplies the charge pump circuit 124 with the up pulse UP or the down pulse DOWN dependent on the phase difference between the data signal DATA and the signal S114. The charge pump circuit 124 performs the current outputting or inputting operation dependent on the up pulse UP or down pulse DOWN from the phase detector 123. The amplifier 174 outputs the voltage dependent on the phase error between the data signal DATA and the signal S114. This voltage is applied to the voltage-controlled oscillator 177, which outputs the signal S177 of the frequency corresponding to the voltage supplied from the amplifier 174 in such a way that the received voltage is used as an offset voltage. The signal S177 is applied to the frequency divider 191.

The frequency divider 191 divides the frequency of the signal S177 received via the amplifier 178 by 16, and the resultant signal S191 is applied to the phase/frequency detector 36 of the PLL circuit 22. The phase/frequency detector 36 outputs the up pulse UP or the down pulse DOWN dependent on the frequency error between the signal S191 and the signal S24, the pulse being input to the charge pump circuit 52. The charge pump circuit 52 performs the current outputting or inputting operation based on the up pulse UP or the down pulse DOWN output from the phase/frequency detector 36. The amplifier 58 receives the output signal of the charge pump circuit 52, and generates the voltages VA and VB based on the frequency error between the signal S191 and the signal S24, the voltages VA and VB being applied to the voltage-controlled oscillator 114.

The voltage-controlled oscillator 114 produces the signal S114 of the frequency corresponding to the voltage difference VA–VB supplied from the amplifier 58 via the loop filter 59. Then, the signal S114 is applied to the frequency divider 24, which divides the frequency of the signal S114 from the oscillator 114 by 16. The resultant signal is input, as the signal S24, to the phase/frequency detector 36.

In the above-described first embodiment of the present invention, the PLL part circuit 23 is equipped with the voltage-controlled oscillator 177 having the piezoelectric resonator 187. The voltage-controlled oscillator 177 thus configured has a gain less than that of the voltage-controlled oscillator 114 using the multivibrator. Hence, the PLL circuit 22 pulls the signal S24 in the frequency-synchronization with the signal S191, and in other words, the signal S114 is made to be frequency-synchronized with the signal S177. The PLL part circuit 23 pulls the signal S114 in the phase-synchronization with the data signal DATA. The PLL part circuit 23 has a phase-synchronizing operation speed lower than the frequency-synchronizing operation of the PLL circuit 22. As a result, upon receipt of the data signal DATA, the frequency of the signal S114 is pulled into synchronization with the frequency of the signal S177 by the PLL circuit 22, and then the phase of the signal S114 is pulled into synchronization with the phase of the data signal DATA by the PLL circuit including the PLL part circuit 23.

The above synchronizing process is as shown in FIG. 3. If the frequency of the data signal DATA has a large deviation when a phase error is detected, the frequency error is detected. Hence, the circuit does not replace the phase error with the frequency error as in the case of the aforementioned conventional PLL circuit. As a result, after the synchronized state is established, this state can be maintained as long as the frequency of the data signal DATA does not deviate greatly, and the stable clock signal regenerating operation can be ensured.

When the phase detector 123 is followed by an integrator, the phase synchronizing operation speed of the PLL part circuit 23 can be much more lower than the frequency synchronizing operation speed of the PLL circuit 22. Hence, the possibility of the phase pull out can be further reduced and much more stable clock signal regenerating operation can be ensured.

FIG. 14 is a waveform diagram of the operation of the first embodiment of the present invention. More particularly, parts (a) through (g) show the waveforms of the signals obtained at nodes in the configuration shown in FIG. 4. In the case shown in FIG. 14, the data signal DATA in part (b) of Fig. 14 leads to the clock signal CLK (S114) in part (a). The clock signal CLK has a frequency of, for example, 1.485 GHz. In this case, the output voltage of the loop filter 175 of the PLL part circuit 23 is increased, as shown in part (c) of FIG. 14. Thus, the oscillation frequency of the external circuit 176 becomes higher, and the frequency of the output signal S191 of the frequency divider 191 is increased, as shown in part (d) of FIG. 14. Accordingly, the output voltage of the loop filter 59 of the PLL circuit 22 is increased, as shown in part (e) of FIG. 14. As a result, the frequency of the clock signal CLK (S114) becomes higher, whereby the edges of the clock signal CLK become coincident with those of the data signal DATA, as shown in parts (f) and (g) of FIG. 14.

A description will now be given, with reference to FIGS. 15 through 19, of a clock signal regenerating circuit according to a second embodiment of the present invention. The second embodiment has a PLL part circuit 193 having a circuit configuration different from that of the PLL part circuit 23 used in the first embodiment. The other parts of the second embodiment are the same as those of the first embodiment.

The PLL part circuit 193 has a phase detector 194 having the same configuration as the phase detector 123 shown in FIG. 4, and a charge pump circuit 195 having the same configuration as the charge pump circuit 124 shown in FIG. 4. The PLL part circuit 193 has an amplifier 196 having the same circuit configuration as the amplifier 58. An input voltage to be applied to the amplifier 196 is externally supplied via a terminal 197 (supplied from the outside of the PLL part circuit 193). The PLL part circuit 193 has a voltage-controlled oscillator 198 operating with the power supply voltage supplied from the amplifier 196. The PLL part circuit 193 has a load capacitance controlling circuit 199, which controls the load capacitance of the voltage-controlled oscillator 198 so that the frequency of an oscillation output S198 of the oscillator 198 can be varied.

Figure 16:
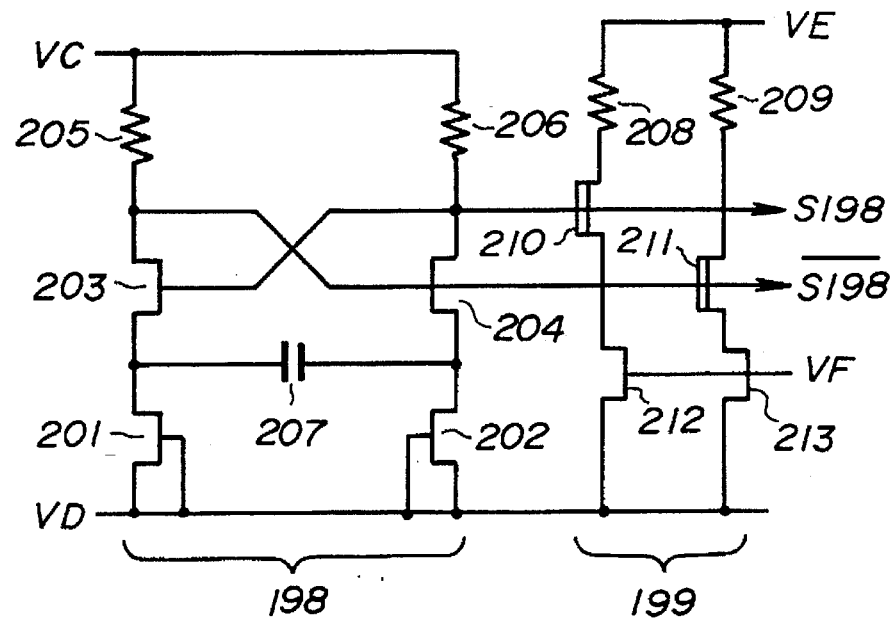
FIG. 16 is a circuit diagram of a voltage-controlled oscillator and a load capacitance controlling circuit used in the second embodiment of the present invention.

FIG. 16 is a circuit diagram of the voltage-controlled oscillator 198 and the load capacitance controlling circuit 199, the circuit 199 having a unique configuration as will be described later. The voltage-controlled oscillator 198 receives output voltages VC and VD from the amplifier 196, which are respectively equal to, for example, 1.4 V and 0 V. The oscillator 198 includes enhancement type GaAs MESFETs 201 and 202 serving as constant-current sources, enhancement type GaAs MESFETs 203 and 204 performing switching operations, load resistors 205 and 206 of the MESFETs 203 and 204, and a capacitor 207 to be charged and discharged. The capacitor 207 is repeatedly charged and discharged by the currents flowing in the GaAs MESFETs 203 and 204. Hence, the GaAs MESFETs 203 and 204 are alternately turned ON and OFF, so that the oscillation outputs S198 and/S198 can be obtained.

The load capacitance controlling circuit 199 receives a power supply voltage of, for example, 3.6 V, and includes resistors 208 and 209, depletion type GaAs MESFETs 210 and 211 for controlling the capacitive load of the voltage-controlled oscillator 198. Further, the circuit 199 includes an enhancement type GaAs MESFET 212 for controlling the current flowing through the GaAs MESFET 210, and an enhancement type GaAs MESFET 213 for controlling the current flowing through the GaAs MESFET 211. Symbol VF denotes a control voltage that controls the currents flowing in the GaAs MESFETs 212 and 213, that is, the currents flowing in the GaAs MESFETs 210 and 211. The above control voltage is controlled by the charge pump circuit 195.

Figure 17:
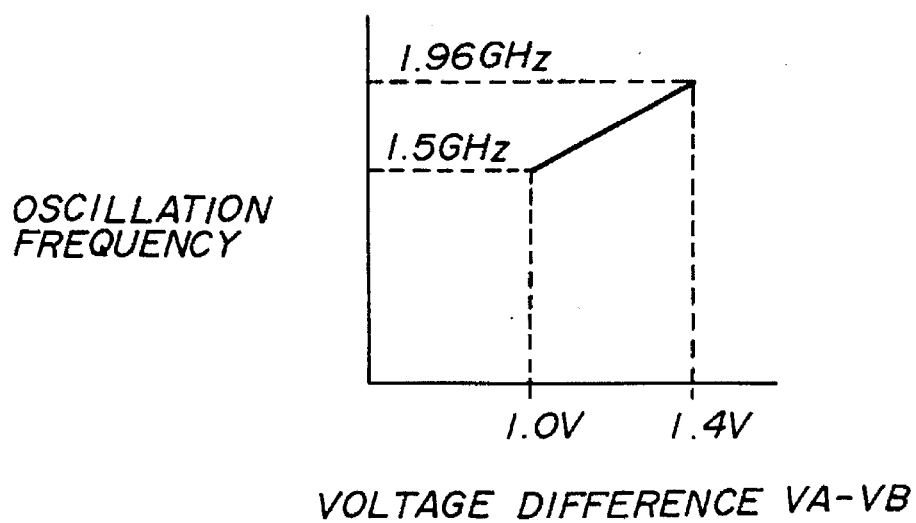
FIG. 17 is a graph of a relationship between the oscillation frequency and the voltage difference regarding the voltage-controlled oscillator used in the first embodiment of the present invention.

The frequencies of the oscillation outputs S114 and/S114 of the aforementioned voltage-controlled oscillator 114 shown in FIG. 4 (FIG. 10) can be varied by varying the voltage difference VA–VB. FIG. 17 shows the relationship between the voltage difference (VA–VB) and the oscillation frequency regarding the oscillator 114. When the voltage difference VA–VB applied to the oscillator 114 is varied from 1.0 V to 1.4 V, the oscillation frequency is changed from 1.5 GHz to 1.96 GHz, and the frequency change rate obtained in this case is equal to 1.16 GHz per 0.1 V variation in the voltage difference VA–VB. Hence, it may be difficult to perform fine control of the oscillation frequency.

The load capacitance controlling circuit 199 used in the second embodiment of the present invention is intended to make it possible to perform fine control of the oscillation frequency of the voltage-controlled oscillator 198 having the same configuration as the oscillator 114. When the value of the control voltage VF is changed, the currents flowing between the drains and sources of the GaAs MESFETs 210 and 211 are varied. Hence, the capacitances between the gates and drains of the GaAs MESFETs 210 and 211 as well as the capacitances between the gates and sources thereof are varied. The gate/drain capacitances and gate/source capacitances of the GaAs MESFETs 210 and 211 are varied, the load capacitance of the voltage-controlled oscillator 198 is changed, so that the oscillation frequency can be changed.

Figure 18:
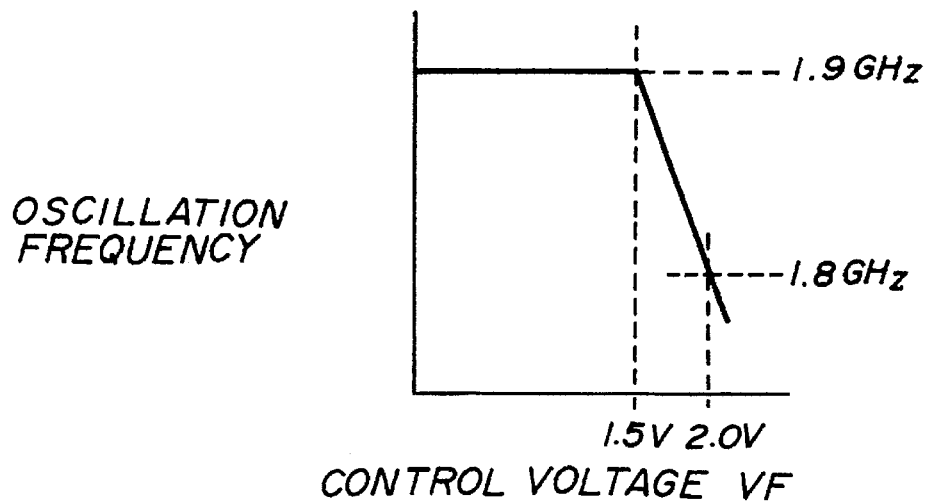
FIG. 18 is a graph of a relationship between the oscillation frequency of the voltage-controlled oscillator and the control voltage applied to the load capacitance controlling circuit.

FIG. 18 is a graph of the relationship between the oscillation frequency of the oscillator 198 and the control voltage VF applied to the load capacitance controlling circuit 199. When the control voltage VF is changed from 1.5 V to 2.0 V, the oscillation frequency is changed from 1.9 GHz to 1.8 GHz. The frequency change rate obtained at this time is equal to 0.2 GHz per 0.1 V variation in the control voltage VF. Hence, the fine oscillation frequency control can be performed.

Table 1 shows examples of the GaAs MESFETs 201–204 and 210–213 forming the voltage-controlled oscillator 198 and load capacitance controlling circuit 199.

TABLE I

|  | Gate Width | Gate Length |
| --- | --- | --- |
| GaAs MESFET 201 | 30 μm | 0.6 μm |
| GaAs MESFET 202 | 30 μm | 0.6 μm |
| GaAs MESFET 203 | 20 μm | 0.6 μm |
| GaAs MESFET 204 | 20 μm | 0.6 μm |
| GaAs MESFET 210 | 5 μm | 1.0 μm |
| GaAs MESFET 211 | 5 μm | 1.0 μm |
| GaAs MESFET 212 | 5 μm | 0.6 μm |
| GaAs MESFET 213 | 5 μm | 0.6 μm |

If the enhancement type GaAs MESFETs 212 and 213 of the load capacitance controlling circuit 199 are replaced by depletion type GaAs MESFETs, there is an increase in the oscillation frequency when the control voltage VF is around 1.5 V. This is because currents flow from the sources of the MESFETs 210 and 211 to the gate thereof. This phenomenon prevents the stable control of the oscillation frequency of the voltage-controlled oscillator 198. For the above reason, it is preferable the GaAs MESFETs 212 and 213 be of the enhancement type.

Figure 19:
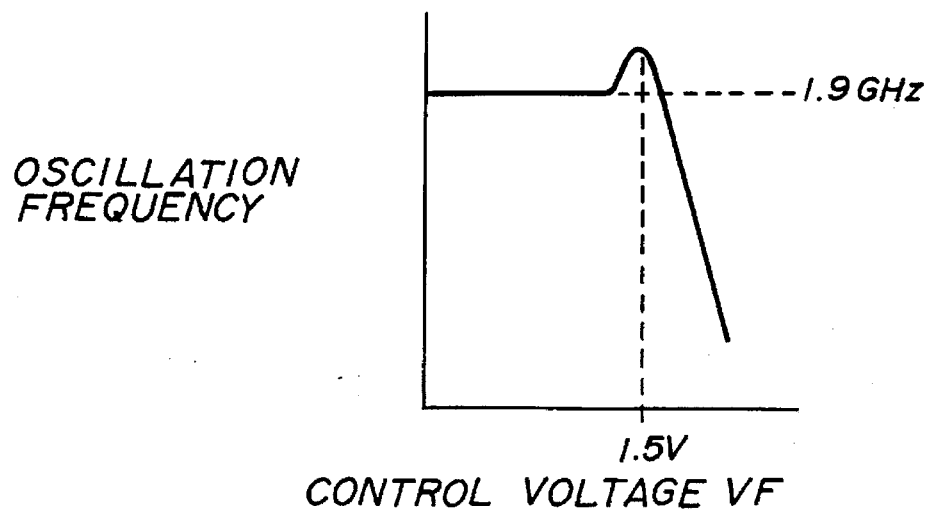
FIG. 19 is a graph of a relationship between the oscillation frequency of the voltage-controlled oscillator and the control voltage obtained when depletion type GaAs MESFETs are used instead of enhancement type GaAs MESFETs.

Further, when the resistors 208 and 209 have appropriate values, the phenomenon shown in FIG. 19 can be prevented. For example, the resistors 208 and 209 are equal to 1 kΩ.

As shown in Table 1, the gate widths of the GaAs MESFETs 210–213 are ¼ of those of the GaAs MESFETs 203 and 204. The gate widths of the GaAs MESFETs 210–213 are increased, the currents flowing between the drains and sources of the GaAs MESFETs 210–213 are increased, so that it becomes liable to encounter the phenomenon shown in FIG. 19. In addition, the gate capacitances becomes large, and hence the oscillation frequency of the voltage-controlled oscillator 198 is varied greatly. This prevents the fine control of the oscillation frequency.

The research and experiments conducted by the inventors show that the gate widths of the GaAs MESFETs 210–213 are preferably less than ⅓ of the gate widths of the GaAs MESFETs 203 and 204.

Figure 15:
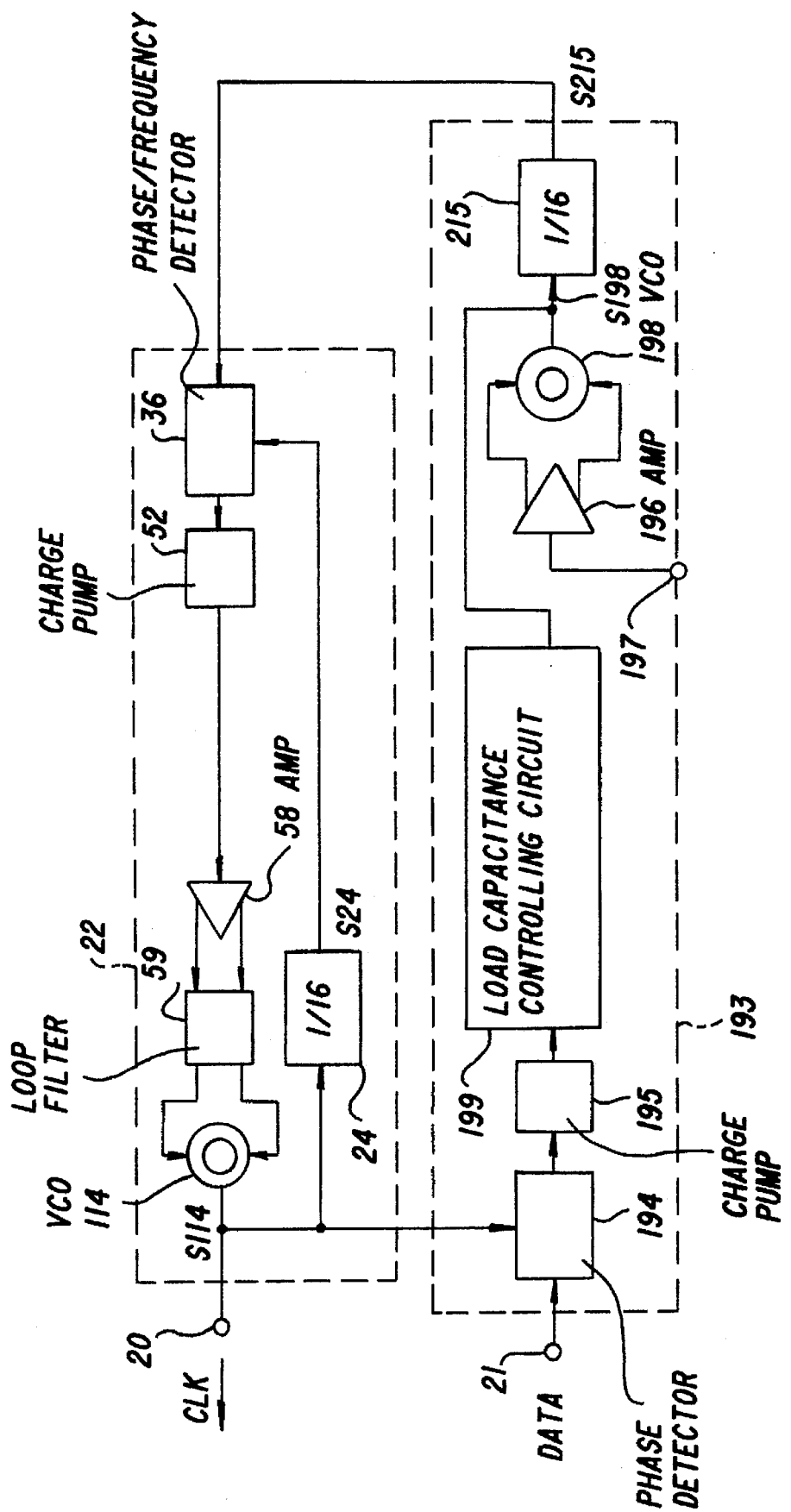
FIG. 15 is a block diagram of a clock signal regenerating circuit according to a second embodiment of the present invention.

A frequency divider 215 shown in FIG. 15 divides the frequency of the signal S198 output from the voltage-controlled oscillator 198 by 16, and has the same configuration as the aforementioned frequency divider 24.

A description will now be given of the operation of the second embodiment of the present invention.

When the data signal DATA is input to the PLL part circuit 193, the phase detector 194 outputs the up pulse UP or the down pulse DOWN based on an phase error between the data signal DATA and the signal S114. The charge pump circuit 195 receives the up pulse UP or the down pulse DOWN and the discharging or charging operation. The amplifier 196 outputs the voltages VC and VD based on the input voltage externally supplied, the voltages VC and VD being supplied, as power supply voltages, to the voltage-controlled oscillator 198.

In the load capacitance controlling circuit 199, the load capacitance of the voltage-controlled oscillator 198 is controlled by the control voltage VF controlled by the charge pump circuit 195, whereby the oscillation frequency of the voltage-controlled oscillator 198 is controlled. That is, the signal S198 having the frequency corresponding to the control voltage VF is output from the voltage-controlled oscillator 198, and is supplied to the frequency divider 215. Then, the frequency divider 215 produces the signal S215 having the frequency equal to 1/16 of that of the signal S198 form the oscillator 198.

The signal S215 is supplied to the phase/frequency detector 36 of the PLL circuit 22. The detector 36 outputs the up pulse UP or the down pulse DOWN based on a frequency error between the signals S215 and S24. The charge pump circuit 52 performs the discharging or charging operation based on the up pulse UP or the down pulse DOWN from the detector 36. The amplifier 58 outputs the voltages VA and VB based on the frequency error between the signals S215 and S24, these voltages VA and VB being applied, as power supply voltages, to the voltage-controlled oscillator 114.

The voltage-controlled oscillator 114 outputs the signal S114 having the frequency equal to the difference VA−VB supplied thereto. The frequency divider 24 receives the signal S114 and divides the frequency thereof by 16, the resultant signal S24 being input to the phase/frequency detector 36.

The load capacitance controlling circuit 199 is used to realize the fine control of the oscillation frequency, and the gain of the oscillator 198 is less than that of the voltage-controlled oscillator 114. Hence, the PLL circuit 22 operates so that the signal S24 is pulled in the frequency-synchronization with the signal S215, and in other words, the signal S114 is pulled in the frequency-synchronization with the signal S198. The second PLL circuit having the PLL part circuit 193 operates so that the signal S114 is pulled into the phase-synchronization with the data signal DATA. In this case, the phase synchronizing operation speed of the PLL part circuit 193 is lower than the frequency synchronizing operation speed of the PLL circuit 22. As a result, in response to receipt of the data signal DATA, the signal S114 is pulled into the frequency-synchronization with the S198 by means of the PLL circuit 22,1 and is then pulled into the phase-synchronization with the data signal DATA by means of the PLL part circuit 193.

That is, the synchronizing process in the second embodiment of the present invention is the same as shown in FIG. 3. If the frequency of the data signal DATA has a large deviation when a phase error is detected, the frequency error is detected. Hence, the circuit does not replace the phase error with the frequency error as in the case of the aforementioned conventional PLL circuit. As a result, after the synchronized state is established, this state can be maintained as long as the frequency of the data signal DATA does not deviate greatly, and the stable clock signal regenerating operation can be ensured.

When the phase detector 194 is followed by an integrator, the phase synchronizing operation speed of the PLL part circuit 193 can be much more lower than the frequency synchronizing operation speed of the PLL circuit 22. Hence, the possibility of the phase pull out can be further reduced and much more stable clock signal regenerating operation can be ensured.

Figure 20:
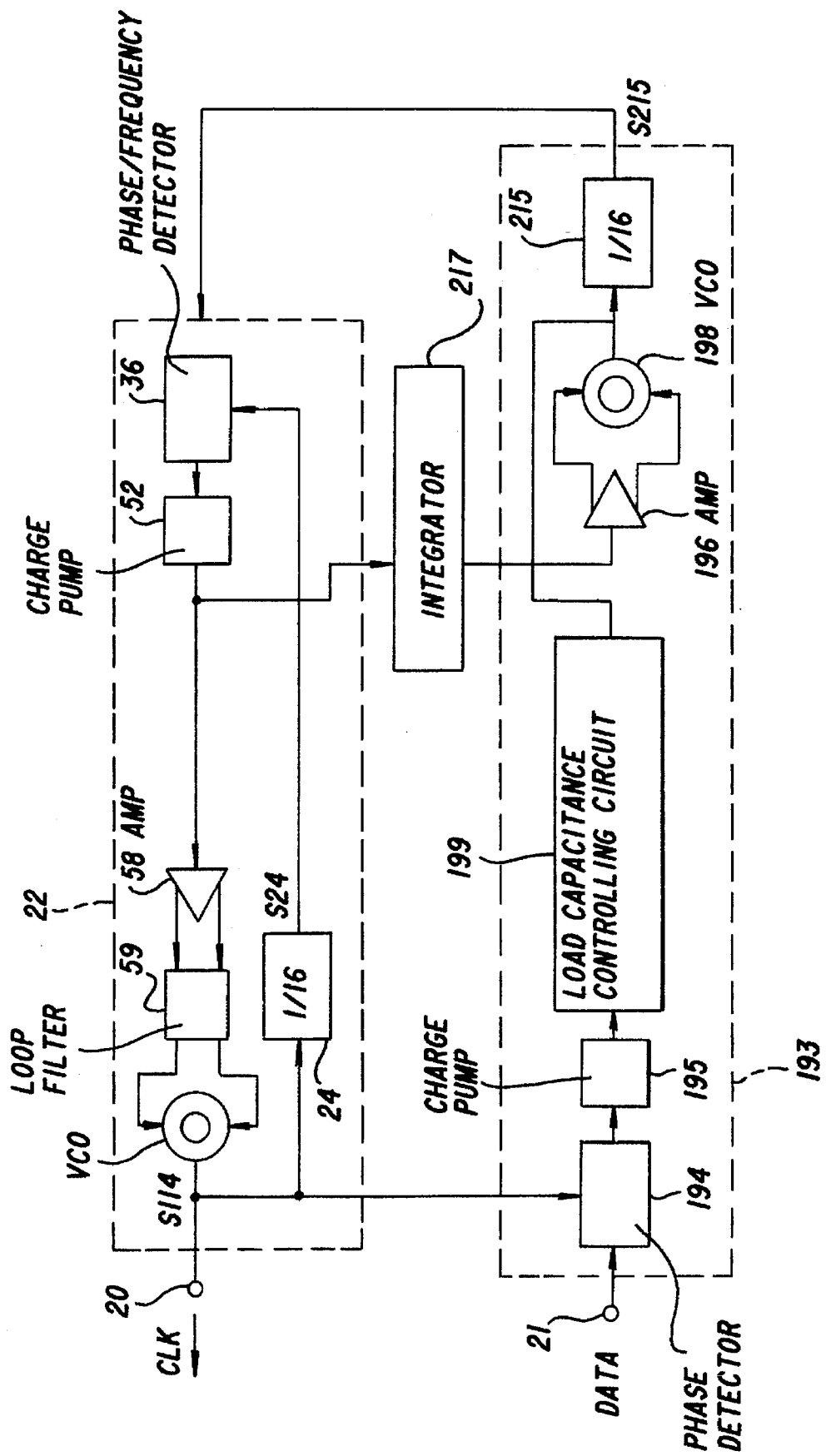
FIG. 20 is a block diagram of a clock signal regenerating circuit according to a third embodiment of the present invention.

A description will now be given, with reference to FIG. 20, of a clock signal regenerating circuit according to a third embodiment of the present invention. In the configuration shown in FIG. 20, an integrator 217 is supplied with the output signal of the charge pump circuit 52. The output signal of the integrator 217 is supplied to the amplifier 196 as its input voltage. The other parts of the configuration shown in FIG. 20 are the same as those of the configuration shown in FIG. 15.

The third embodiment of the present invention has the same functions and effects as those of the second embodiment thereof. In addition, it is not necessary to supply the amplifier 196 with its input voltage from the outside of the configuration shown in FIG. 20 because the amplifier receives the input voltage from the integrator 217. Furthermore, it is possible to easily control the oscillation frequencies of the oscillators 114 and the 198 to an identical frequency.

Moreover, the possibility of the phase pull out can be further reduced and much more stable clock signal regenerating operation can be ensured. This is because the input voltage of the amplifier 196 is given from the charge pump circuit 52 of the PLL circuit 22 via the integrator so that the response speed of the voltage-controlled oscillator 198 is reduced.

For example, the integrator 217 is configured so that the time necessary for the frequency variation of the oscillator 198 is equal to or greater than ten times the time necessary for the frequency variation of the oscillator 114.

When the phase detector 194 is followed by an integrator, the phase synchronizing operation speed of the PLL part circuit 193 can be much more lower than the frequency synchronizing operation speed of the PLL circuit 22. Hence, the possibility of the phase pull out can be further reduced and much more stable clock signal regenerating operation can be ensured.

As shown in FIG. 4, it is possible to provide all the parts other than the external circuit 176 on a chip or a circuit board. It is also possible to provide all the parts including the external circuit 176 on a chip or a circuit board. As shown in FIGS. 15 and 20, it is possible to provide all the parts on a chip or a circuit board. It is also possible to use some parts of the configuration shown in FIG. 15 or FIG. 20 as external parts.

Figure 21:
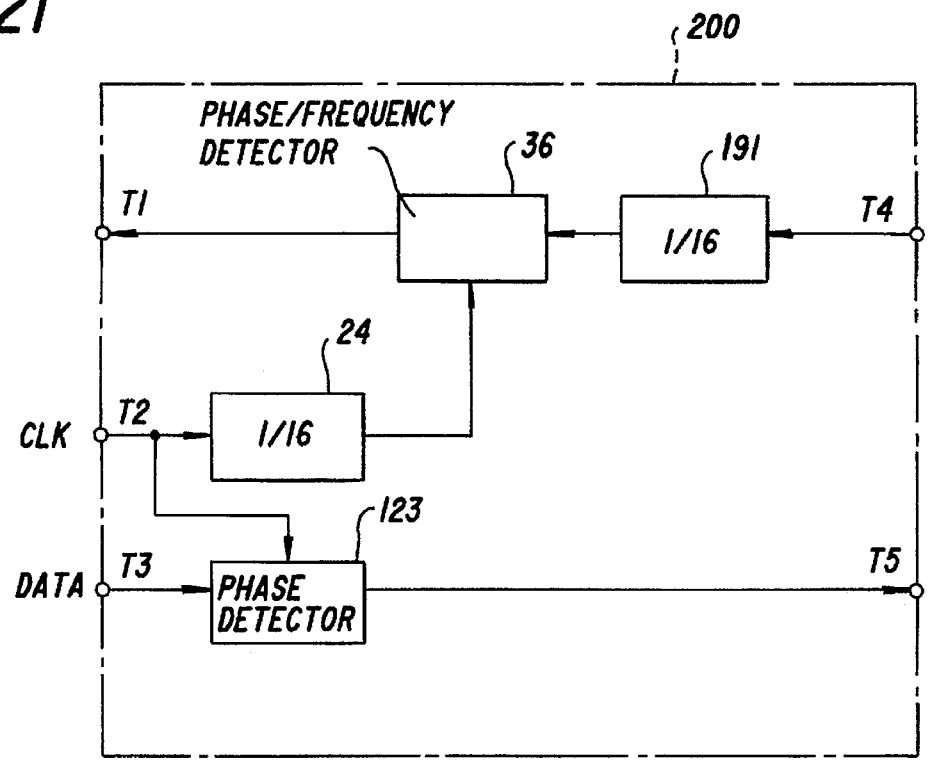
FIG. 21 is a block diagram of a chip used to form the first embodiment of the present invention.

FIG. 21 shows a first chip configuration used to form the clock signal regenerating circuit according to the first embodiment of the present invention. On a chip 200, there are provided only the frequency dividers 24 and 191, the phase/frequency detector 36, and the phase detector 123. The other parts shown in FIG. 4 are used as external parts. That is, the charge pump, the amplifier 174, the loop filter 175 and the external circuit 176 are connected between terminals T5 and T4. The charge pump 52, the amplifier 58, the loop filter 59 and the voltage-controlled oscillator 114 are connected between terminals T1 and T2. The data signal DATA is applied to the phase detector 123 via a terminal T3.

Figure 22:
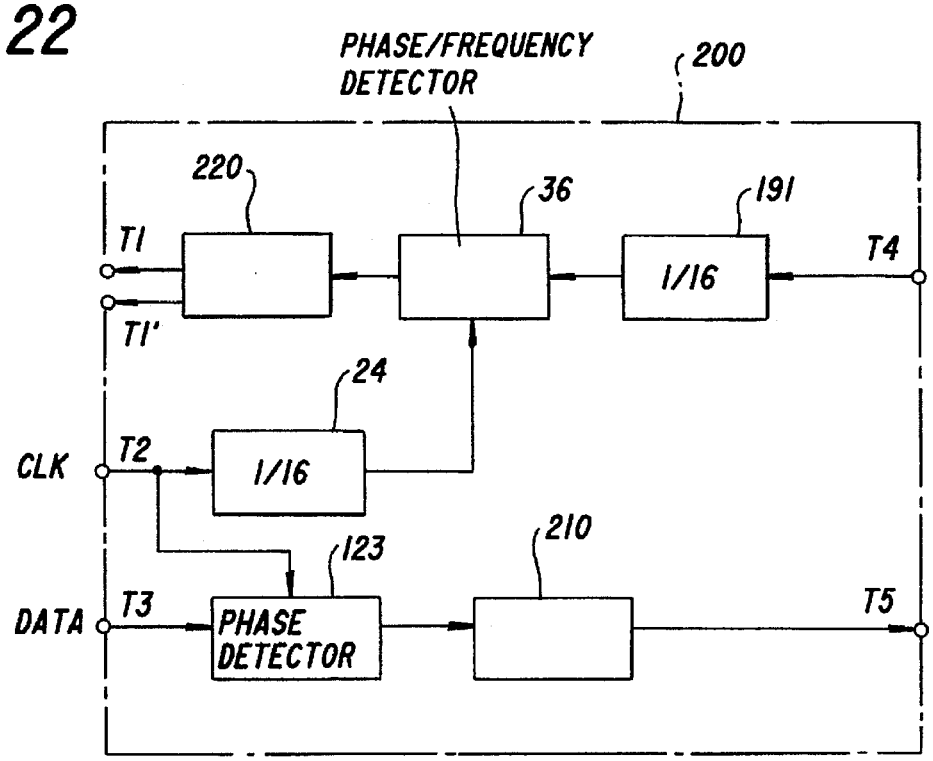
FIG. 22 is a block diagram of a second chip used to form the first embodiment of the present invention.

FIG. 22 shows a second chip configuration used to form the clock signal regenerating circuit according to the first embodiment of the present invention. On the chip 200, blocks 210 and 220 are provided in addition to the configuration shown in FIG. 21. The block 210 corresponds to the charge pump 124, the amplifier 174 and the loop filter 175. The block 220 corresponds to the charge pump 52, the amplifier 58 and the loop filter 59. The voltage-controlled oscillator 114 shown in FIG. 4 is handled as an external element. The external circuit 176 shown in FIG. 4 is connected across the terminals T5 and T4. The outputs of the loop filter 59 are externally output via terminals T1 and T1'.

Figure 23:
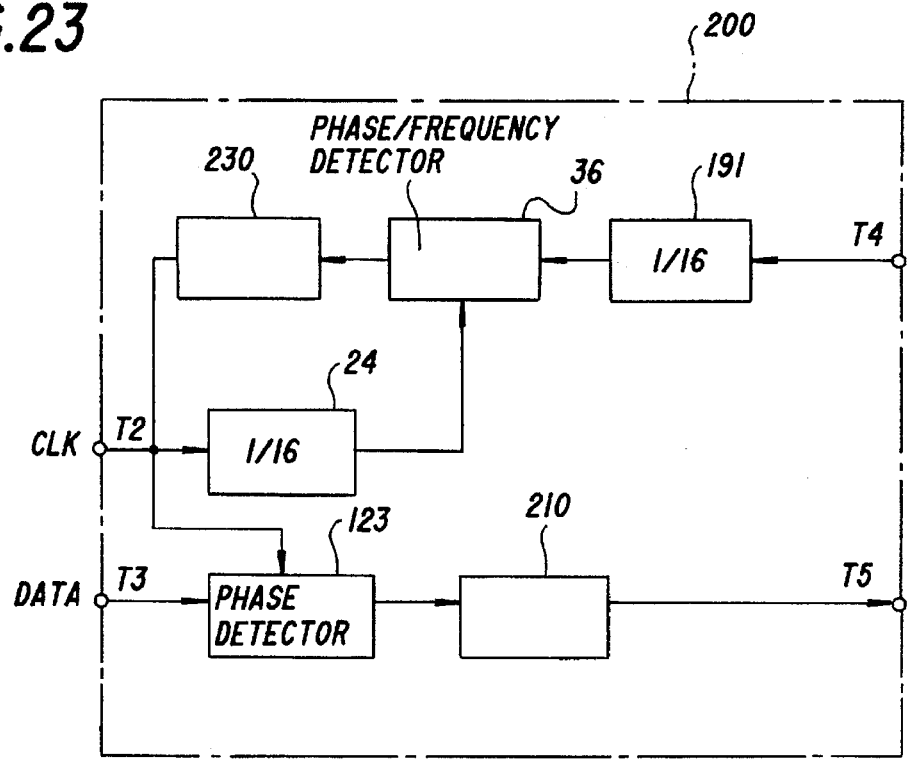
FIG. 23 is a block diagram of a third chip used to form the first embodiment of the present invention.

FIG. 23 shows a third chip configuration used to form the clock signal regenerating circuit according to the first embodiment of the present invention. A block 230 is substituted for the block 220 shown in FIG. 22, and the other parts shown in FIG. 23 are the same as those in FIG. 22. The block 230 is made up of the charge pump 52, the amplifier 58, the loop filter 59 and the voltage-controlled oscillator 114.

Figure 24:
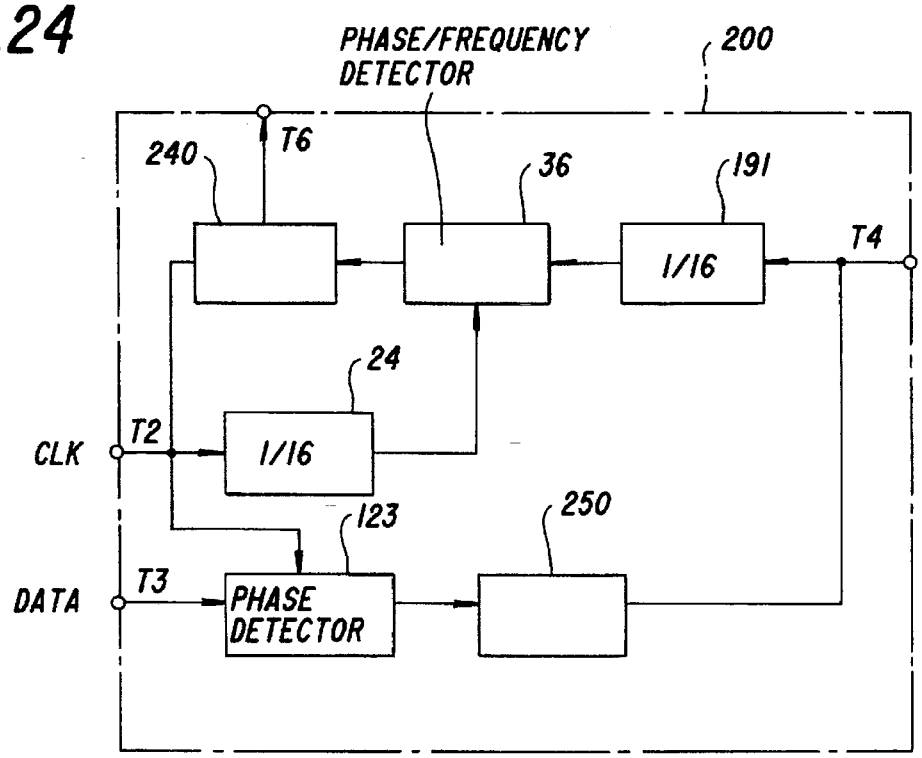
FIG. 24 is a block diagram of a chip used to form the second or third embodiment of the present invention.

FIG. 24 shows a fourth chip configuration used to form the clock signal regenerating circuit according to the second or third embodiment of the present invention. A block 250 corresponds to the charge pump circuit 195 and the load capacitance controlling circuit 199 shown in FIG. 15 or FIG. 20. The output signal of the block 250, that is, the output signal of the load capacitance controlling circuit 199 is applied to the frequency divider 215. The output signal of the voltage-controlled oscillator 198 shown in FIG. 15 or FIG. 20 is applied to the terminal T4. A block 240 shown in FIG. 24 is the same as the block 230 when the configuration shown in Fig. 24 forms the second embodiment of the present invention. When the configuration shown in FIG. 24 is used to form the third embodiment of the present invention, the block 240 includes the integrator 217, the output of which is externally output via a terminal T6.

There are other variations of the chip configuration although they are not described here.

The present invention is not limited to the specifically disclosed embodiments, and variations and modifications may be made without departing from the scope of the present invention.

What is claimed is:

1. A clock signal regenerating circuit comprising:
   a first PLL circuit;
   a PLL part circuit connected to an output of said first PLL circuit, said PLL part circuit forming a second PLL circuit, the second PLL circuit performing a phase-synchronizing operation on a clock signal output from said first PLL circuit and a data signal input to said PLL part circuit, the first PLL circuit performing a frequency-synchronizing operation on the clock signal and an output signal of said PLL part circuit, said clock signal being taken as an output of the clock signal regenerating circuit,
   the phase-synchronizing operation having a speed lower than that of the frequency-synchronizing operation.

2. The clock signal regenerating circuit as claimed in claim 1, wherein:
   the first PLL circuit has a first voltage-controlled oscillator; and
   the PLL part circuit has a second voltage-controlled oscillator having a gain different from that of the first voltage-controlled oscillator.

3. The clock signal regenerating circuit as claimed in claim 1, wherein:
   the first PLL circuit has a first voltage-controlled oscillator; and
   the PLL part circuit has a terminal to which a second voltage-controlled oscillator having a gain different from that of the first voltage-controlled oscillator can be externally connected.

4. The clock signal regenerating circuit as claimed in claim 1, wherein:
   the first PLL circuit has a first terminal to which a first voltage-controlled oscillator can be externally connected; and
   the PLL part circuit has a second terminal to which a second voltage-controlled oscillator having a gain different from that of the first voltage-controlled oscillator can be externally connected.

5. The clock signal regenerating circuit as claimed in claim 1, wherein:
   the first PLL circuit has a first voltage-controlled oscillator; and
   the PLL part circuit has a second voltage-controlled oscillator which is identical to that of the first voltage-controlled oscillator, and a load capacitance controlling circuit which controls a load capacitance of the second voltage-controlled oscillator.

6. The clock signal regenerating circuit as claimed in claim 1, wherein:
   the first PLL circuit has a first voltage-controlled oscillator; and
   the PLL part circuit has a second voltage-controlled oscillator which is identical to that of the first voltage-controlled oscillator, and a load capacitance controlling circuit which controls a load capacitance of the second voltage-controlled oscillator,
   said second voltage-controlled oscillator externally receiving a control voltage which controls the speed of the phase-synchronizing operation.

7. The clock signal regenerating circuit as claimed in claim 1, wherein:
   the first PLL circuit has a first voltage-controlled oscillator; and
   the PLL part circuit has a second voltage-controlled oscillator which is identical to that of the first voltage-controlled oscillator, and a load capacitance controlling circuit which controls a load capacitance of the second voltage-controlled oscillator, and
   wherein the clock signal regenerating circuit further comprises an integrator which controls the speed of the phase-synchronizing operation.

8. The clock signal regenerating circuit as claimed in claim 1, wherein:
   the first PLL circuit has a first voltage-controlled oscillator and a first frequency divider; and
   the PLL part circuit has a second voltage-controlled oscillator having a gain different from that of the first voltage-controlled oscillator, and a second frequency divider.

9. The clock signal regenerating circuit as claimed in claim 1, wherein said PLL part circuit comprises a voltage-controlled oscillator having first and second field effect transistors which alternately turn ON and OFF to thereby produce first and second oscillation outputs having a complementary relationship,
   wherein said PLL part circuit comprises a load capacitance controlling circuit that controls a load capacitance of said voltage-controlled oscillator, and
   wherein said load capacitance controlling circuit comprises:

a first resistance element having a first end connected to high-potential-size power supply line, and a second end;

a third field effect transistor having a drain connected to the second end of said first resistance element, a gate connected to a drain of said first field effect transistor, and a source;

a fourth field effect transistor having a drain connected to the source of the third field effect transistor, a source connected to a low-potential-side power supply line, and a gate receiving a control voltage;

a second resistance element having a first end connected to said high-potential-side power supply line, and a second end;

a fifth field effect transistor having a drain connected to the second end of said second resistance element, a gate connected to the drain of said second field effect transistor, and a source;

a sixth field effect transistor having a drain connected to the source of said fifth field effect transistor, a source connected to the low-potential-side power supply line, and a gate receiving said control voltage.

* * * * *